US009086715B2

(12) United States Patent
Riehl

(10) Patent No.: US 9,086,715 B2
(45) Date of Patent: Jul. 21, 2015

(54) VOLTAGE REGULATOR, ENVELOPE TRACKING POWER SUPPLY SYSTEM, TRANSMITTER MODULE, AND INTEGRATED CIRCUIT DEVICE THEREFOR

(75) Inventor: Patrick Stanley Riehl, Cambridge, MA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 72 days.

(21) Appl. No.: 13/823,116

(22) PCT Filed: Jul. 19, 2011

(86) PCT No.: PCT/US2011/044409
§ 371 (c)(1),
(2), (4) Date: Mar. 14, 2013

(87) PCT Pub. No.: WO2012/044391
PCT Pub. Date: Apr. 5, 2012

(65) Prior Publication Data
US 2013/0176076 A1    Jul. 11, 2013

Related U.S. Application Data

(60) Provisional application No. 61/387,693, filed on Sep. 29, 2010.

(51) Int. Cl.
*H03G 3/20*  (2006.01)
*G05F 1/62*  (2006.01)
*H02M 3/156* (2006.01)
*H02M 3/158* (2006.01)
*H03G 3/00*  (2006.01)

(52) U.S. Cl.
CPC ............... *G05F 1/62* (2013.01); *H02M 3/156* (2013.01); *H02M 3/158* (2013.01); *H03G 3/004* (2013.01); *H03G 3/20* (2013.01)

(58) Field of Classification Search
CPC ............................... H03G 3/004; H03G 3/20
USPC .................... 330/127, 297, 136; 323/282
See application file for complete search history.

(56) References Cited

U.S. PATENT DOCUMENTS

| 6,914,487 B1 | 7/2005 | Doyle |
| 7,190,150 B2 | 3/2007 | Chen |

(Continued)

FOREIGN PATENT DOCUMENTS

| CN | 101611532 A | 12/2009 |
| EP | 1 575 152 B1 | 4/2009 |
| TW | 200929859 | 7/2009 |

OTHER PUBLICATIONS

"International Search Report" mailed on Nov. 17, 2011 for International application No. PCT/US11/44409, International filed: Jul. 19, 2011.

*Primary Examiner* — Robert Pascal
*Assistant Examiner* — Khiem Nguyen
(74) *Attorney, Agent, or Firm* — Winston Hsu; Scott Margo

(57) ABSTRACT

A voltage regulator for use within an envelope tracking power supply system is described. The voltage regulator comprises a voltage regulation module. The voltage regulation module comprises at least one energy storage element, the at least one energy storage element comprising a first terminal operably coupled to a first node of the voltage regulation module, and a second terminal operably coupled to a second node of the voltage regulation module. The voltage regulation module further comprises an input arranged to receive a reference voltage supply signal, the input being selectively couplable to the first node and selectively couplable to the second node, an output selectively couplable to the first node and selectively couplable to the second node, and a ground plane selectively couplable to the second node.

18 Claims, 6 Drawing Sheets

(56) References Cited

U.S. PATENT DOCUMENTS

| | | | |
|---|---|---|---|
| 7,622,984 B2 * | 11/2009 | Lesso et al. | 327/536 |
| 7,679,433 B1 | 3/2010 | Li | |
| 8,093,945 B2 * | 1/2012 | Wimpenny | 330/129 |
| 2009/0302941 A1 | 12/2009 | Wimpenny | |
| 2009/0323378 A1 | 12/2009 | Melse | |

* cited by examiner

VOLTAGE REGULATOR, ENVELOPE TRACKING POWER SUPPLY SYSTEM, TRANSMITTER MODULE, AND INTEGRATED CIRCUIT DEVICE THEREFOR

BACKGROUND

The field of this invention relates to a voltage regulator, an envelope tracking power supply system, a transmitter module and an integrated circuit device therefor.

In the field of advanced wireless transmitters, a technique known as envelope tracking can be used to improve power efficiency. With envelope tracking, the supply voltage to the power amplifier (PA) of the wireless transmitter is caused to approximately track the envelope of the transmitted radio-frequency (RF) signal. Thus, since the power dissipation in the PA is proportional to the difference between its supply voltage and output voltage, envelope tracking enables a reduction of power dissipation, and thereby power consumption, whilst allowing the PA to produce the intended radio frequency (RF) output.

This power reduction is possible if a switching regulator, such as a buck converter, is used to efficiently supply power to the PA. However, it is difficult to realize a buck converter that can modulate its output at a rate that is fast enough to match the envelope of a modern wireless communication system. Research has shown that a switching regulator arrangement comprising a buck converter in parallel with a Class-AB amplifier can provide power savings while tracking fast enough to support high data rate modulation schemes. In such a scheme, the Class-AB amplifier needs to be fast enough and powerful enough to cancel the ripple current that is output from the buck converter, as well as providing the high-frequency modulation. However, such a scheme comprising a buck converter is limited to providing the PA with a voltage that is less than that of the input power supply. In advanced wireless transmitters, the PA sometimes requires a voltage supply that is higher than that of the input power supply, typically provided by a lithium-ion battery.

There is therefore a need for an efficient voltage regulator that can step voltage either 'up' or 'down', and be connected in parallel with a Class-AB amplifier in order to track voltage fluctuations fast enough to support high-data-rate modulation schemes in an envelope tracking system.

A non-inverting buck-boost topology is not suitable for this application because its output current (the current that is integrated on its output capacitor) is not continuous. The Class-AB amplifier would therefore need to cancel a large alternating current at the switching frequency, with a magnitude larger than the load current.

A canonical single-inductor dc-dc converter does not have the ability to step up or down in a non-inverting fashion and also does not have a continuous output current.

An inverse-SEPIC (Single-Ended Primary-Inductor Converter), which uses two inductors, does have a continuous current output, and does have the ability to step up/down in a non-inverting fashion. However, this type of converter has the significant drawback that the voltage across some of the switches in the off state is twice that of the input supply voltage. For a power management integrated circuit (PMIC), this is a significant drawback because the voltage tolerance is usually chosen to be roughly equal to the input supply voltage.

Thus, a need exists for an improved voltage regulator apparatus for use within an envelope tracking power supply system.

SUMMARY

Accordingly, the invention seeks to mitigate, alleviate or eliminate one or more of the above mentioned disadvantages singly or in any combination. Some examples of aspects of the invention provide voltage boosting capability combined with a continuous output current without the need for high-voltage-tolerant transistors and with only one additional passive component.

According to a first aspect of the invention, there is provided a voltage regulator for use within an envelope tracking power supply system. The voltage regulator comprises a voltage regulation module. The voltage regulation module comprises at least one energy storage element. The at least one energy storage element comprises a first terminal operably coupled to a first node of the voltage regulation module, and a second terminal operably coupled to a second node of the voltage regulation module. The voltage regulator module further comprises an input arranged to receive a reference voltage supply signal, the input being selectively couplable to the first node and selectively couplable to the second node. The voltage regulator module further comprises an output selectively couplable to the first node and selectively couplable to the second node, and a ground plane selectively couplable to the second node.

In this manner, in one example embodiment of the invention, the voltage regulation module is capable of being configured (by way of the selective coupling of the first and second nodes thereof) in a plurality of modes; each mode capable of providing a different voltage level at the output. Thus, by causing the voltage regulation module to switch between such operating modes, a time-averaged voltage signal may be generated based on the different voltage levels of the operating modes and a temporal ratio of the different operating modes. In particular, the energy storage element enables a reference voltage supply signal received at the input of the voltage regulation module to be 'boosted', thus enabling a voltage level greater than the received voltage supply signal to be generated. As such, the voltage regulation module is capable of providing at its output a time-averaged voltage signal that is greater than the reference supply voltage signal.

According to some optional features of the invention, the voltage regulator may further comprise a control module that is arranged to selectively configure the voltage regulation module to operate in at least one from a group consisting of: a first operating mode in which the output of the voltage regulation module and the ground plane are operably coupled to the second node of the voltage regulation module; and at least a second operating mode in which the output of the voltage regulation module is operably coupled to the first node of the voltage regulation module and the input of the voltage regulation module is operably coupled to the second node of the voltage regulation module.

In this manner, in the first operating mode, the output of the voltage regulation module may be operably coupled (via the second node) to the ground plane, thus providing a 'low' (e.g. substantially 'zero' in this example) voltage level at the output of the voltage regulation module. Significantly, since the output is operably coupled substantially directly to the ground plane in this first operating mode, the ground plane provides a current source for the output, thereby enabling a continuous current to be provided at the output of the voltage regulation module during this first operating mode. Furthermore, in the at least one further operating mode, the output of the voltage regulation module is operably coupled to the input of the voltage regulation module via the energy storage element. In particular, the first terminal of the energy storage element may be operably coupled to the output. Similarly, the second terminal of the energy storage element may be operably coupled to the input. Accordingly, the voltage provided to the output of the voltage regulation module will comprise a voltage at the input that is 'boosted' by a 'stored' voltage across the energy storage element. In addition, since the output is operably coupled to the input via the energy storage element in the at least one further operating mode, the input together with the energy storage element provide a current source for the output, enabling a continuous current to be provided at the output during this at least one further operating mode.

According to some optional features of the invention, the control module may be arranged to selectively configure the voltage regulation module to operate in the first operating mode when the input is operably coupled to the first node.

In this manner, in the first operating mode, the first terminal of the energy storage element is operably coupled to the input of the voltage regulation module, whilst the second terminal of the energy storage element is operably coupled to the ground plane therefor. As such, an input voltage may be applied across the energy storage element, from the first terminal to the second terminal, thereby allowing current to flow (at least initially) into the energy storage element, thereby charging the energy storage element. In this example, operably coupling the energy storage element in this manner enables a voltage of up to the reference voltage supply signal to be 'stored' within the energy storage element. Thus, the voltage provided to the output of the voltage regulation module in the at least one further operating mode may comprise a voltage up to twice that of the input voltage. Accordingly, by switching the operation of the voltage regulation module between the first and at least one further operating modes, a voltage signal comprising a time-averaged value ranging from substantially zero volts (i.e. substantially equal to the voltage level of the ground plane) up to almost twice the input voltage may be achieved.

According to some optional features of the invention, the control module may be further arranged to selectively configure the voltage regulation module to operate in a third operating mode in which the output of the voltage regulation module and the input of the voltage regulation module are operably coupled to the first node of the voltage regulation module.

In this manner, the output of the voltage regulation module may be operably coupled (via the first node) to the input, thus providing the input voltage at the output of the voltage regulation module. Significantly, since the output of the voltage regulation module is operably coupled substantially directly to the input voltage in this third operating mode, the input voltage supply provides a current source for the output, thereby enabling a continuous current to be provided at the output of the voltage regulation module during this third mode operating mode.

According to some optional features of the invention, the control module may be arranged to selectively configure the voltage regulation module to operate in the third operating mode when the ground plane is operably coupled to the second node of the voltage regulation module. In this manner, the first terminal of the energy storage element may be operably coupled to the input of the voltage regulation module, whilst the second terminal of the energy storage element is operably coupled to the ground plane therefor. As such, the input voltage supply signal is effectively applied across the energy storage element, from the first terminal to the second terminal, thereby allowing current to flow (at least initially) into the energy storage element, and thereby charging the energy storage element. Accordingly, this third mode of operation enables the energy storage element to be 're-charged' without a need to reduce the voltage at the output of the voltage regulation module to be lowered down to the voltage level of the ground plane.

According to some optional features of the invention, the control module may be further arranged to receive at an input thereof at least one control signal, and to cause the voltage regulation module to switch between the operating modes with a temporal ratio based, at least partly, on the at least one control signal.

According to some optional features of the invention, the at least one energy storage element may comprise at least one capacitor.

According to some optional features of the invention, the output of the voltage regulation module may be selectively couplable to the first node by a first switching element controllable by a first configuration signal, and selectively couplable to the second node by a second switching element that is controllable by a second configuration signal. Furthermore, the input of the voltage regulation module may be selectively couplable to the first node by a third switching element, in turn controllable by a third configuration signal, and selectively couplable to the second node by a fourth switching element that is, in turn, controllable by a fourth configuration signal. Furthermore, the ground plane may be selectively couplable to the second node by a fifth switching element that is controllable by a fifth configuration signal.

According to some optional features of the invention, the switching elements may comprise metal oxide semiconductor field effect transistors (MOSFETs).

According to some optional features of the invention, the voltage regulator may further comprise a low pass filter operably coupled to the output of the voltage regulation module.

According to a second aspect of the invention, there is provided an envelope tracking power supply system comprising at least one voltage regulator according to the first aspect of the invention.

According to some optional features of the invention, the envelope tracking power supply system may comprise at least a first voltage regulator according to the first aspect of the invention, the at least first voltage regulator being operably coupled in parallel with a Class AB amplifier to provide a voltage supply to a power amplifier.

According to some optional features of the invention, the envelope tracking power supply system may further comprise at least one further voltage regulator according to the first aspect of the invention, the at least one further voltage regulator being arranged to provide a voltage supply to the Class AB amplifier.

According to a third aspect of the invention, there is provided a transmitter module comprising an envelope tracking power supply system according to the second aspect of the invention.

According to a fourth aspect of the invention, there is provided an integrated circuit device comprising at least one voltage regulator according to the first aspect of the invention.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

Figure 1:
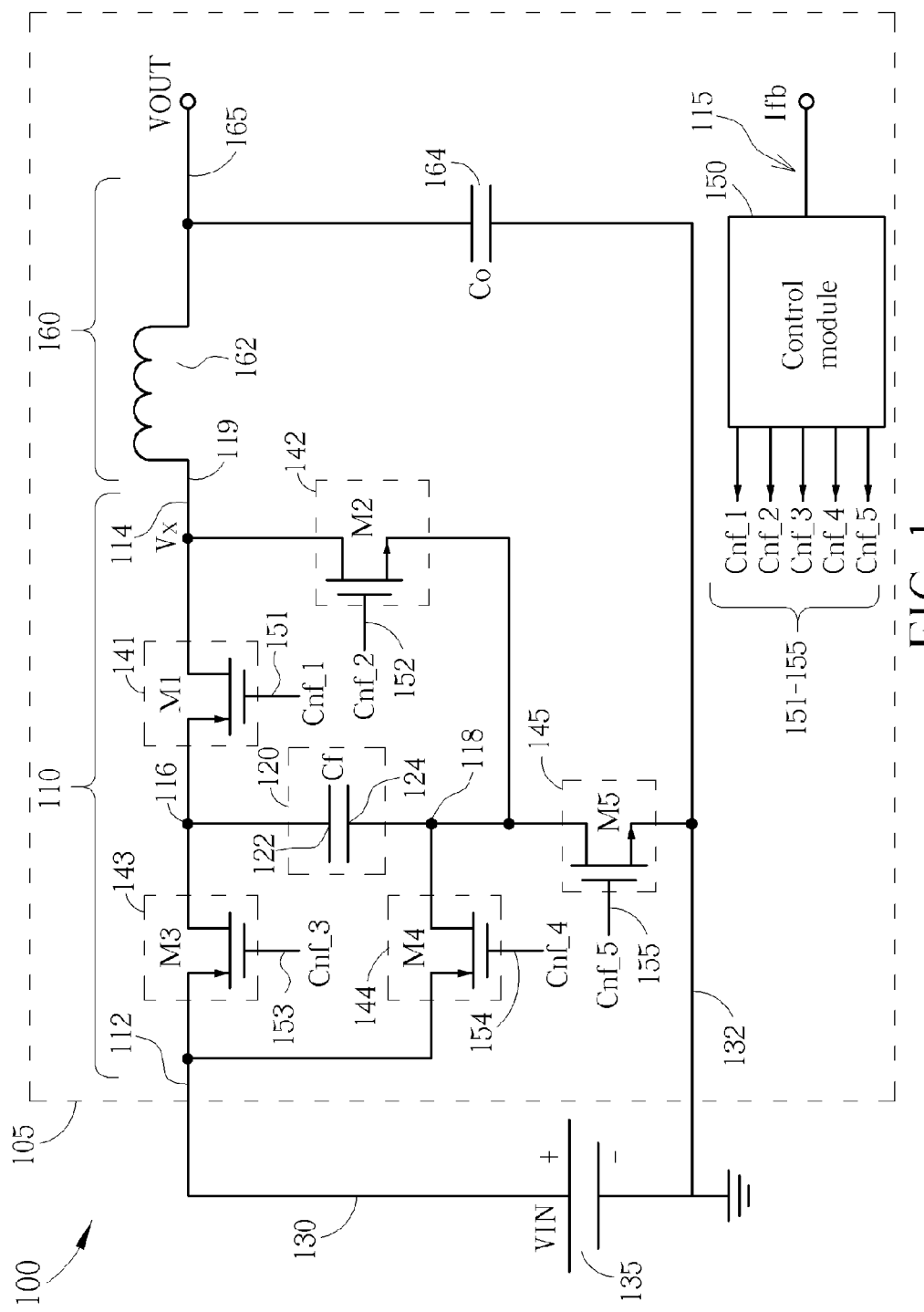
FIG. 1 illustrates a simplified block diagram of an example of a voltage regulator.

The illustrated embodiments of the present invention may for the most part, be implemented using electronic components and circuits known to those skilled in the art. As such, details will not be explained in any greater extent than that considered necessary for the understanding and appreciation of the underlying concepts of the present invention and in order not to obfuscate or distract from the teachings of the present invention Referring first to FIG. 1, there is illustrated a simplified block diagram of an example of a voltage regulator 100 for use within an envelope tracking power supply system, such as may be implemented within an advanced wireless transmitter (not shown) or the like. For the illustrated example, the voltage regulator 100 is implemented within an integrated circuit device, illustrated generally at 105. The voltage regulator 100 comprises a voltage regulation module, illustrated generally at 110. The voltage regulation module 110 comprises an input 112 arranged to receive a reference voltage supply signal VIN 130, which for the illustrated example is provided by a battery 135. The voltage regulation module 110 is arranged to convert the received reference voltage supply signal VIN 130 into a time-averaged voltage signal Vx 119, which the voltage regulation module 110 provides at an output 114 thereof.

More specifically, the voltage regulation module 110 comprises an energy storage element 120, which for the illustrated example comprises a capacitor device. The energy storage element 120 comprises a first terminal 122 operably coupled to a first node 116 of the voltage regulation module 110, and a second terminal 124 operably coupled to a second node 118 of the voltage regulation module 110. The input 112 of the voltage regulation module 110 is selectively couplable to the first node 116, and selectively couplable to the second node 118. Furthermore, the output 114 is also selectively couplable to the first node 116, and selectively couplable to the second node 118. A ground plane of the voltage regulation module 110, illustrated at 132, is selectively couplable to the second node 118.

In this manner, the voltage regulation module 110 is capable of being configured (by way of the selective coupling of the first and second nodes 116, 118 thereof) in a plurality of operating modes; where each mode is capable of providing a different voltage level at the output 114. Thus, and as described in greater detail below, by causing the voltage regulation module 110 to switch between such operating modes, a time-averaged voltage signal Vx 119 may be generated based on the different voltage levels of the operating modes and a temporal ratio of the different operating modes.

In particular, and as described in greater detail below, the energy storage element 120 enables the reference voltage supply signal VIN 130 received at the input 112 of the voltage regulation module 110 to be 'boosted', thus enabling a voltage level greater than the received voltage supply signal VIN 130 to be generated. As such, the voltage regulation module 110 is capable of providing at its output 114 a time-averaged voltage signal Vx 119 greater than the reference voltage supply signal VIN 130.

For the example illustrated in FIG. 1, the first and second nodes 116, 118 are capable of being selectively coupled to via switching elements controllable by way of configuration signals. In particular, the output 114 of the voltage regulation module 110 is selectively couplable to the first node 116 by a first switching element 141 controllable by a first configuration signal 151, and selectively couplable to the second node 118 by a second switching element 142 controllable by a second configuration signal 152. The input 112 of the voltage regulation module 110 is selectively couplable to the first node 116 by a third switching element 143 controllable by a third configuration signal 153, and selectively couplable to the second node 118 by a fourth switching element 144, controllable by a fourth configuration signal 154. The ground plane 132 is selectively couplable to the second node 118 by a fifth switching element 145 controllable by a fifth configuration signal 155. The switching elements for the illustrated example comprise metal oxide semiconductor field effect transistors (M1 to M5) 141, 142, 143, 144, 145, which advantageously enable efficient and high frequency switching. The switching elements may comprise transistors; and specifically for the illustrated example the first, third and fourth switching elements 141, 143, 144 comprise p-type metal oxide semiconductor field effect transistors (MOSFETs), and the second and fifth switching elements 142, 145 comprise n-type MOSFETs.

The voltage regulator 100 further comprises a control module 150 arranged to selectively configure the voltage regulation module 110 to operate in a plurality of operating modes. In particular for the illustrated example, the control module 150 is arranged to configure the voltage regulation module 110 to operate in different operating modes by providing appropriate configuration signals 151 to 155 to the respective switching elements 141 to 145.

Figure 2:
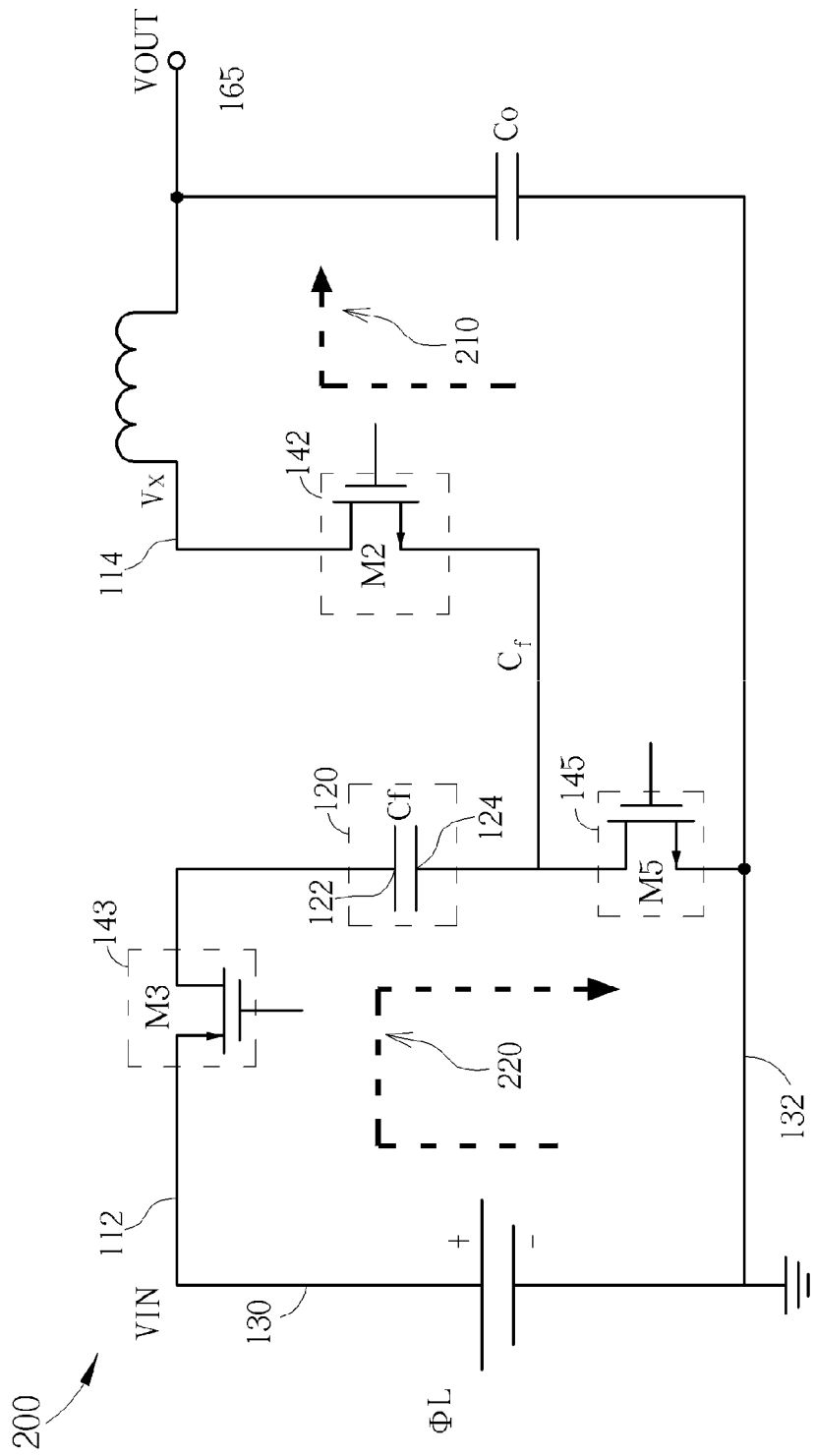
FIG. 2 illustrates a simplified block diagram of a first example of an operating mode for the voltage regulation module of FIG. 1.

FIG. 2 illustrates a simplified block diagram of a first example of an operating mode 200 for the voltage regulation module 110. In this first operating mode 200, the switching elements M2 142 and M5 145 are configured to operably couple the output 114 of the voltage regulation module 110 and the ground plane 132 to the second node 118 of the voltage regulation module 110. In this manner, the output 114 of the voltage regulation module 110 is operably coupled (via the second node 118) to the ground plane 132, thus providing a 'low' (i.e. substantially zero in this example) voltage level at the output 114 of the voltage regulation module. Significantly, and as illustrated at 210, since the output 114 is operably coupled substantially directly to the ground plane 132 in this first operating mode 200, the ground plane 132 provides a current source for the output 114, thereby enabling a continuous current to be provided at the output 114 during this first operating mode 200.

In addition for the illustrated example, in this first operating mode 200, the switching element M3 143 is configured to operably coupled the input 112 of the voltage regulation module 110 to the first node 116. In this manner, the first terminal 122 of the energy storage element 120 is operably coupled to the input 112 of the voltage regulation module 110, whilst the second terminal 124 of the energy storage element 120 is operably coupled to the ground plane 132 therefor. As such, the reference voltage supply signal VIN 130 is effectively applied across the energy storage element 120, from the first terminal 122 to the second terminal 124, allowing current to flow (at least initially) into the energy storage element 120, as illustrated at 220, in order to charge the energy storage element 120. In some examples, operably coupling the energy storage element 120 in this manner enables a voltage of up to the reference voltage supply signal VIN 130 to be 'stored' within the energy storage element 120.

For this first operating mode 200, the switching elements M1 141 and M4 144 are configured to be 'open', i.e. to not provide a connection.

Figure 3:
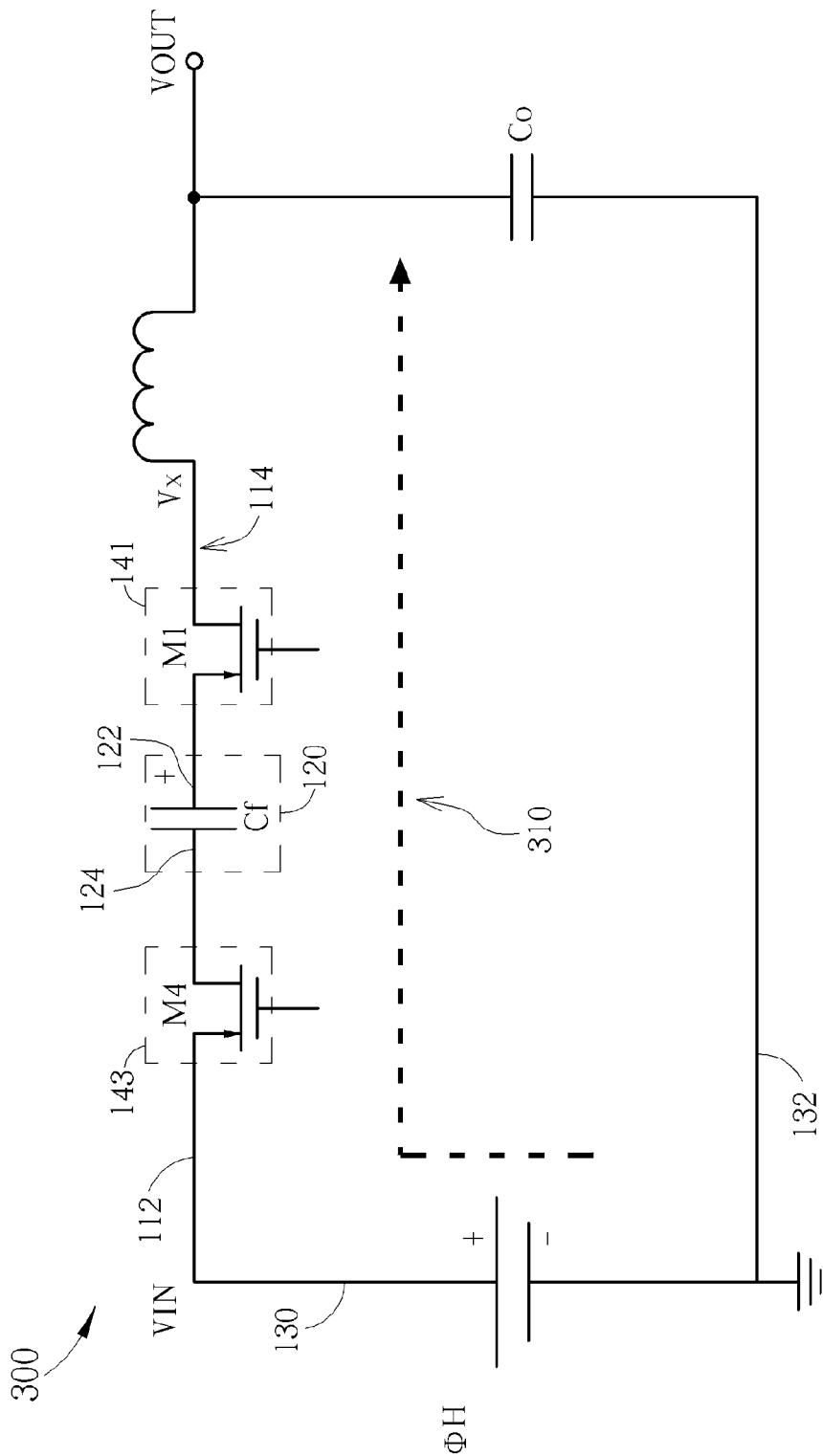
FIG. 3 illustrates a simplified block diagram of a second example of an operating mode for the voltage regulation module of FIG. 1.

FIG. 3 illustrates a simplified block diagram of a second example of an operating mode 300 for the voltage regulation module 110. In this second operating mode 300, the switching element M1 141 is configured to operably couple the output 114 of the voltage regulation module 110 to the first node 116 of the voltage regulation module 110, and the switching element M4 144 is configured to operably couple the input 112 of the voltage regulation module 110 to the second node 118 of the voltage regulation module 110. In this manner, the output 114 of the voltage regulation module 110 is operably coupled to the input 112 of the voltage regulation module 110 via the energy storage element 120. In particular, the first terminal 122 of the energy storage element 120, which in the first operating mode 200 was operably coupled to the input 112, is operably coupled to the output 114 in this second operating mode 300. Similarly, the second terminal 124 of the energy storage element 120, which in the first operating mode 200 was operably coupled to the ground plane 132, is operably coupled to the input 112 in this second operating mode 300. Accordingly, the voltage provided to the output 114 of the voltage regulation module 110 will comprise the reference voltage supply signal VIN 130 at the input 112 'boosted' by the voltage across the energy storage element 120. Thus, the voltage provided to the output 114 of the voltage regulation module 110 in this second operating mode 200 may comprise a voltage up to twice that of the reference voltage supply signal VIN 130. Accordingly, by switching the operation of the voltage regulation module 110 between the first and second operating modes 200, 300, a voltage signal Vx 119 comprising a time-averaged value ranging from substantially zero volts (i.e. substantially equal to the voltage level of the ground plane 132) up to almost twice the reference voltage supply signal VIN 130 may be achieved.

For this second operating mode 300, the switching elements M2 142, M3 143 and M5 145 are configured to be 'open', i.e. to not provide a connection.

Significantly, and as illustrated at 310, since the output 114 is operably coupled to the input 112 via the energy storage element 120 in this second operating mode 200, the input and energy storage element 120 provide a current source for the output 114, enabling a continuous current to be provided at the output during this first operating mode 200. Furthermore, and as illustrated in FIG. 1, although a voltage greater than the reference voltage supply signal VIN 130 is able to be provided at the output 114, none of the switching elements 141 to 145 experience a voltage across them greater than the reference voltage supply signal VIN 130, in particular when in an 'open' state, thus meeting the voltage tolerance requirements for power management integrated circuits (PMICs), which is usually chosen to be roughly equal to the input supply voltage.

In particular, for the illustrated example, the first, third and fourth switching elements 141, 143, 144 comprise p-type MOSFETs. Similarly, for the illustrated example, the second and fifth switching elements 142, 145 comprise n-type MOSFETs. In the second operating mode 300, a voltage equal to approximately twice the input voltage 112 appears at node 114. However, the voltage difference between the source and drain terminals of each of the five MOSFET switches is limited to the input voltage 112. The voltage at 118, the source of M2 142 and drain of M5 145 is equal to the input voltage 112. Thus, the voltage difference between the source and drain of M2 and M5 is equal to the input voltage 112.

Figure 4:
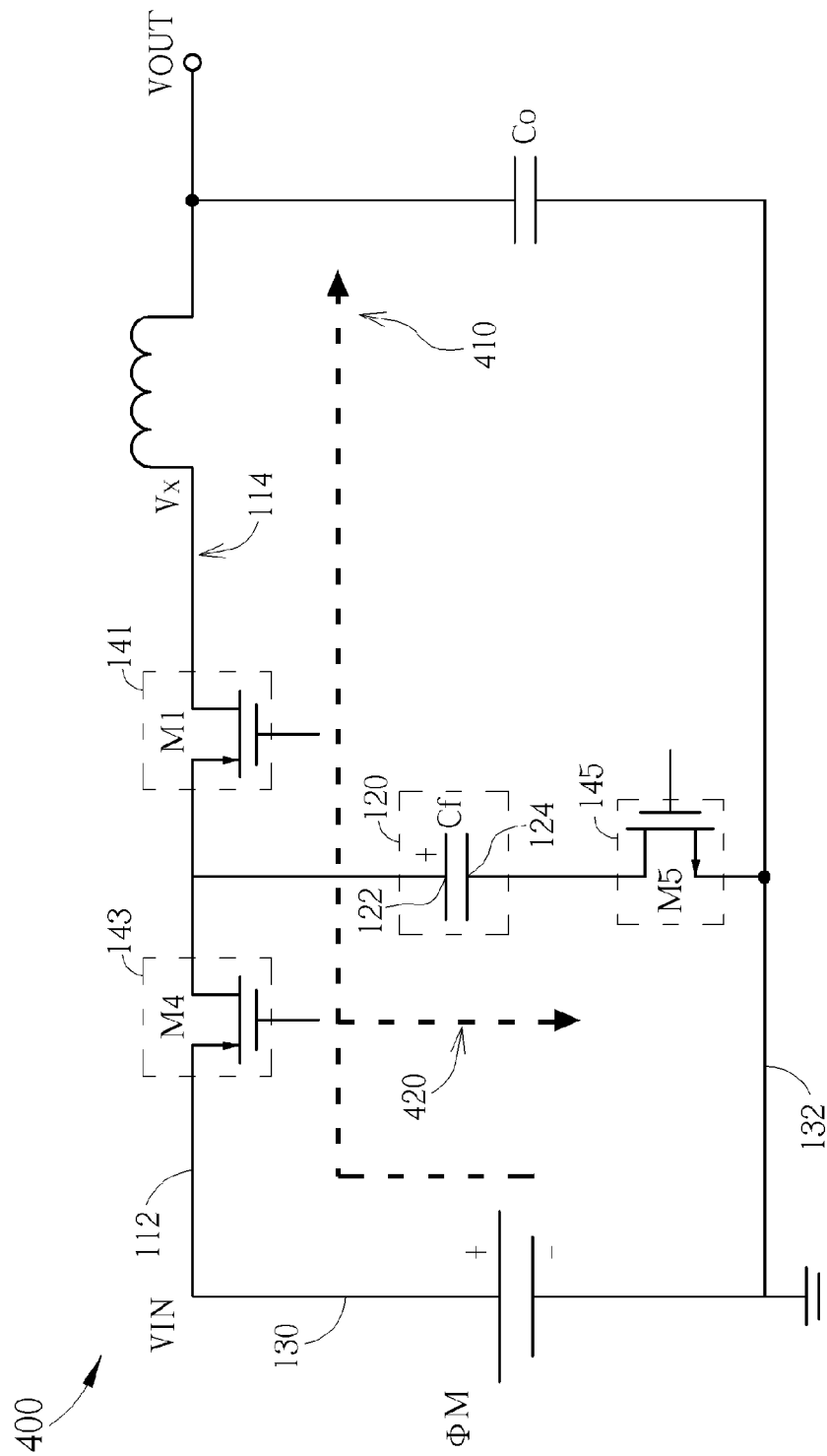
FIG. 4 illustrates a simplified block diagram of a third example of an operating mode for the voltage regulation module of FIG. 1.

FIG. 4 illustrates a simplified block diagram of a third example of an operating mode 400 for the voltage regulation module 110. In this third operating mode 400, the switching elements M1 141 and M3 143 are configured to operably couple the output 114 of the voltage regulation module 110 and the input 112 of the voltage regulation module 110 to the first node 116 of the voltage regulation module 110. In this manner, the output 114 of the voltage regulation module 110 is operably coupled (via the first node 116) to the input 112, thus providing the reference voltage supply signal VIN 130 at the output 114 of the voltage regulation module 110. Significantly, and as illustrated at 410, since the output 114 is operably coupled substantially directly to the reference voltage supply signal VIN 130 in this third operating mode 400, the reference voltage supply signal VIN 130 (or more specifically the battery 135 in the illustrated example) provides a current source for the output 114, thereby enabling a continuous current to be provided at the output 114 during this third operating mode 400.

In addition for the illustrated example, in this third operating mode 400, the switching element M5 145 is configured to operably couple the ground plane 132 to the second node 116 of the voltage regulation module 110. In this manner, the first terminal of the energy storage element 120 is operably coupled to the input 112 of the voltage regulation module 110, whilst the second terminal 124 of the energy storage element 120 is operably coupled to the ground plane 132 therefor. As such, the reference voltage supply signal VIN 130 is effectively applied across the energy storage element 120, from the first terminal 122 to the second terminal 124, thereby allowing current to flow (at least initially) into the energy storage element 120, as illustrated at 420, in order to charge the energy storage element 120. As previously mentioned, operably coupling the energy storage element 120 in this manner enables a voltage of up to the reference voltage supply signal VIN 130 to be 'stored' within the energy storage element 120. Accordingly, this third mode of operation enables the energy storage element 120 to be 're-charged' without a need to reduce the voltage at the output 114 of the voltage regulation module 110 to the voltage level of the ground plane 132.

For this third operating mode 400, the switching elements M2 142 and M4 144 are configured to be 'open', i.e. to not provide a connection.

Referring back to FIG. 1, the control module 150 for the illustrated example is further arranged to receive at an input 115 thereof at least one control signal (such as control signal 515 illustrated in FIGS. 5 and 6), and to cause the voltage regulation module 110 to switch between at least two of the operating modes 200, 300, 400 with a temporal ratio based at least partly on the received at least one control signal(s).

The voltage regulator 100 for the illustrated example further comprises a low pass filter, illustrated generally at 160, operably coupled to the output 114 of the voltage regulation module 110, and arranged to receive the time-averaged voltage signal Vx 119 output by the voltage regulation module 110, and to filter the time-averaged voltage signal Vx 119 to provide a regulated voltage signal at an output 165 of the voltage regulator 100. The low pass filter 160 for the illustrated example comprises a simple LC filter comprising a single inductor 162 operably coupled in series with the time-averaged voltage signal Vx 119, and a decoupling capacitor 164 operably coupled between the output 165 of the voltage regulator 100 and the ground plane 132. In some examples, the low pass filter 160 may be equally implemented with any suitable alternative low pass filter arrangement, and that the LC filter of the illustrated example is not intended to be limiting in any way.

Thus, a voltage regulator 100 has been illustrated and described that utilises a mode-switching operation in order to generate a regulated voltage signal. As will be appreciated by a skilled artisan, the use of such a mode switching operation provides an efficient means of providing such a regulated voltage signal, enabling tight power management requirements to be met. Furthermore, and as identified above, the voltage regulator 100 of FIG. 1 is able to provide step-voltage conversion, thereby enabling a regulated voltage larger than the reference voltage supply signal VIN 130 to be provided. In addition, and as also identified above, the voltage regulator 100 of FIG. 1 is able to provide a continuous current output in each of its operating modes, thus making it suitable for operably coupling in parallel with, say, a Class AB amplifier without a need for the Class AB amplifier to cancel a large alternating current at the switching frequency, with a magnitude that is larger than the load current. Furthermore, and as identified above, the voltage across the switching elements 141 to 145 in the off, or 'open' state does not exceed the input supply voltage, thus meeting typical voltage tolerance requirements for power management integrated circuits (PMICs). A further advantageous feature of the voltage regulator 100 of FIG. 1 is that, including the low pass filter, the voltage regulator 100 only comprises a single inductance 162, and two capacitances 120, 164, thereby minimizing BOM (bill of material) costs for the voltage regulator 100, and improving efficiency thereof.

Figure 5:
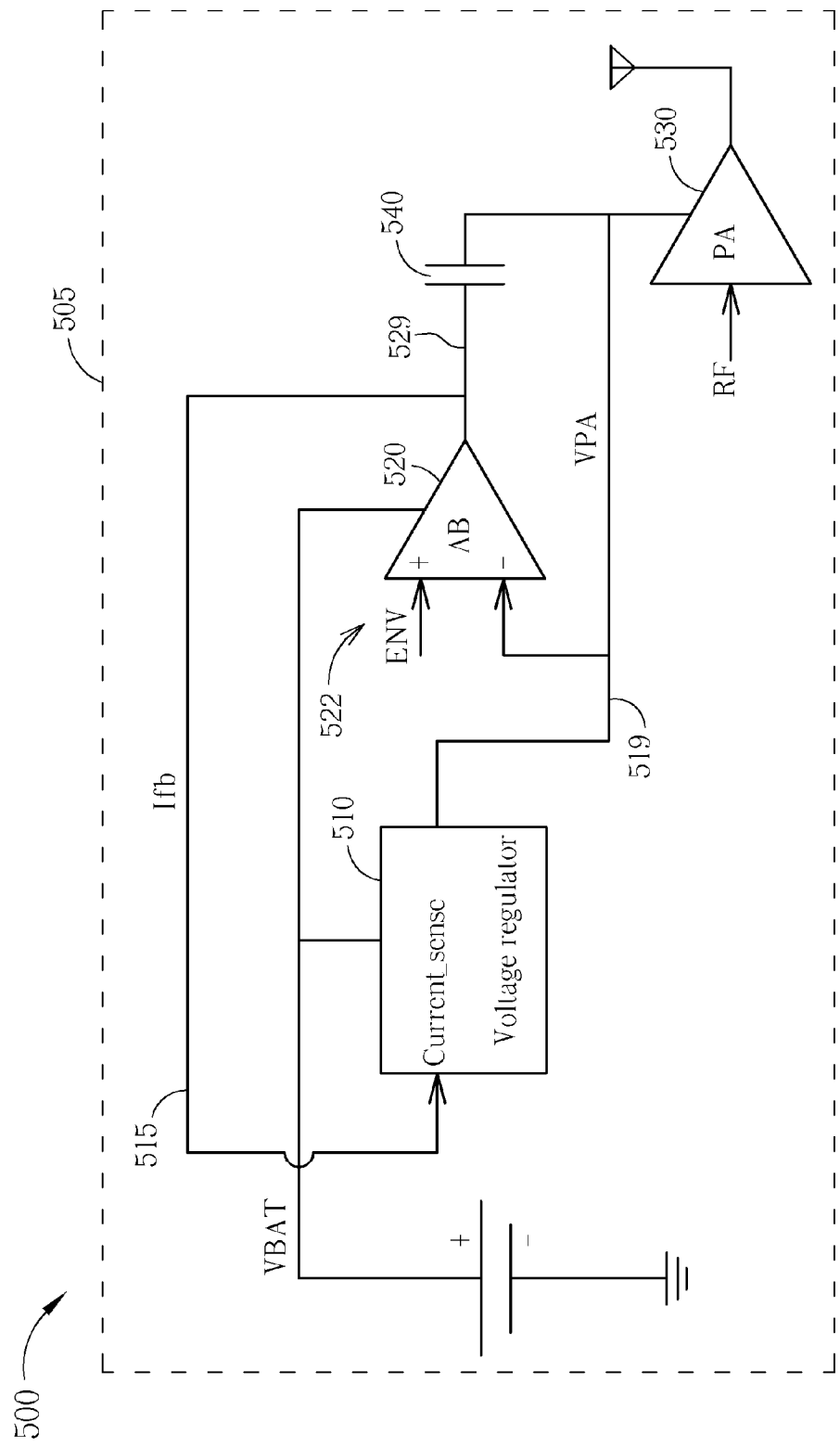
FIG. 5 illustrates a simplified block diagram of an example of an envelope tracking power supply system.
Figure 6:
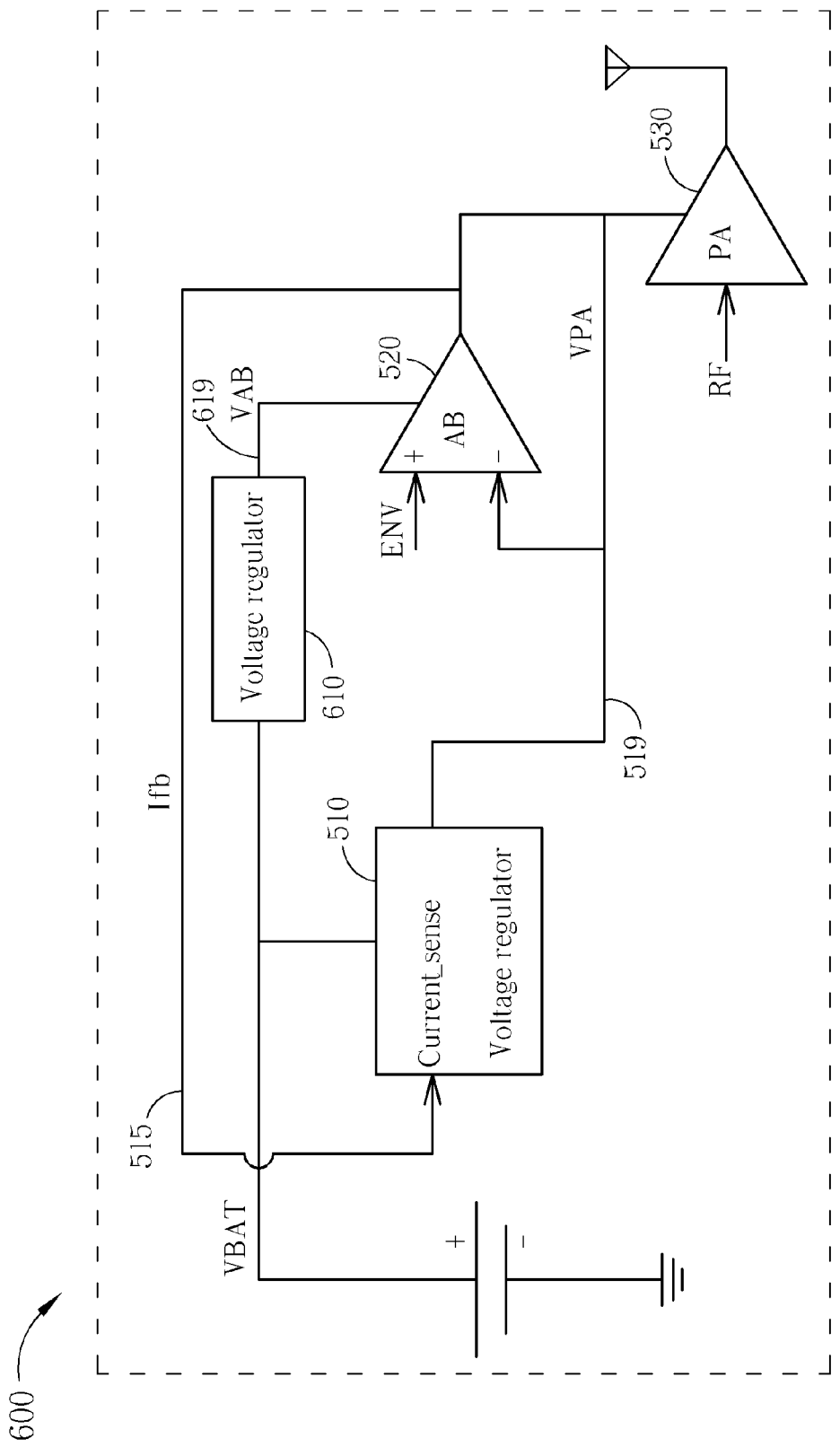
FIG. 6 illustrates a simplified block diagram of an alternative example of an envelope tracking power supply system.

Referring now to FIG. 5, there is illustrated a simplified block diagram of an example of an envelope tracking power supply system 500. For the illustrated example, the envelope tracking power supply system 500 forms part of a transmitter module 505, and comprises a voltage regulator arrangement arranged to provide a supply voltage to a power amplifier (PA) 530 of the transmitter module 505. In particular, the envelope tracking power supply system 500 comprises a voltage regulator 510, for example implemented by way of the voltage regulator 100 of FIG. 1, operably coupled in parallel with a Class AB amplifier 520 in order to provide a voltage supply to the power amplifier 530. As illustrated in FIG. 5, a regulated voltage signal 519 output by the voltage regulator 510 is provided to the PA 530 as its voltage supply. An output 529 of the Class AB amplifier 520 is operably coupled to the regulated voltage signal 519 via a capacitor 540. The Class AB amplifier 520 receives as inputs the regulated voltage signal 519 output by the voltage regulator 510 and a target envelope tracking signal 522. In this manner, the Class AB amplifier 520 is arranged to output a signal that is representative of a difference between the regulated voltage signal 519 output by the voltage regulator 510 and the target envelope tracking signal 522. The output 529 of the Class AB amplifier 520 is fed back to the voltage regulator 510 as a control signal 515, for example to the input 115 of the control module 150 in FIG. 1. In this manner, the voltage regulator 510 is able to modify the regulated voltage signal 519 output thereby in accordance with the output 529 of the Class AB amplifier 520, which is dependent on the difference between the regulated voltage signal 519 output by the voltage regulator 510 and the target envelope tracking signal 522. Furthermore, by coupling the output 529 of the Class AB amplifier 520 to the regulated voltage signal 519 via the capacitor 540, the Class AB amplifier 520 is able to provide a level of ripple cancellation in the regulated voltage signal 519 provided to the PA 530.

In this manner, the supply voltage to the PA 530 may be caused to approximately track the envelope of the transmitted radio-frequency (RF) signal, as defined by the target envelope tracking signal 522. Thus, since the power dissipation in the PA 530 is proportional to the difference between its supply voltage and output voltage, such envelope tracking may enable a reduction of power dissipation, and thereby power consumption, whilst allowing the PA 530 to produce the intended output Referring now to FIG. 6, there is illustrated a simplified block diagram of an alternative example of an envelope tracking power supply system 600. In a similar manner to the envelope tracking power supply system 500 of FIG. 5, the envelope tracking power supply system 600 of FIG. 6 comprises a first voltage regulator 510, for example implemented by way of the voltage regulator 100 of FIG. 1, operably coupled in parallel with a Class AB amplifier 520 to provide a voltage supply to a power amplifier (PA) 530. However, for the example illustrated in FIG. 6, the envelope tracking power supply system 600 further comprises a voltage regulator 610, for example also implemented by way of the voltage regulator 100 of FIG. 1, the further voltage regulator 610 being arranged to provide a voltage supply 619 to the Class AB amplifier 520. In this manner, the power supply provided to the Class AB amplifier may be optimized to further improve the efficiency of the envelope tracking power supply system 600. For example, the supply voltage 619 to the Class AB amplifier 520 may be adjusted to a voltage level that is slightly higher than the AC (alternating current) output voltage amplitude of the Class-AB amplifier 520, thus minimizing power dissipation in the class-AB amplifier 520. The optimized supply voltage 619 may be either above or below that of the input supply 112. Advantageously, the continuous output current of the voltage regulator 610 substantially alleviates the possibility for AC currents injected at node 619 to corrupt the PA supply voltage, thus creating unwanted interference in the transmitted waveform.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner.

Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected", or "operably coupled", to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an", limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage regulator for use within an envelope tracking power supply system; the voltage regulator comprising a voltage regulation module; the voltage regulation module comprising:

a first capacitor comprising a first terminal operably coupled to a first node of the voltage regulation module, and a second terminal operably coupled to a second node of the voltage regulation module;

an input arranged to receive a supply voltage, the input being selectively couplable to the first node and selectively couplable to the second node;

a ground plane selectively couplable to the second node;

a switching output selectively couplable to the first node and selectively couplable to the ground plane; and a power filter formed by an inductor comprising a first terminal operably coupled to the switching output and a second terminal operably coupled to a regulated output voltage; and a second capacitor comprising a first terminal operably coupled to the regulated output and a second terminal operably coupled to the ground plane.

2. The voltage regulator of claim 1 wherein the voltage regulator further comprises a control module arranged to selectively configure the voltage regulation module.

3. The voltage regulator of claim 2 wherein the control module is arranged to selectively configure the voltage regulation module to operate in a first operating mode in which the switching output of the voltage regulation module and the ground plane are operably coupled to the second node of the voltage regulation module.

4. The voltage regulator of claim 3 wherein the control module is arranged to selectively configure the voltage regulation module to operate in at least a second operating mode in which the switching output of the voltage regulation module is operably coupled to the first node of the voltage regulation module and the input of the voltage regulation module is operably coupled to the second node of the voltage regulation module.

5. The voltage regulator of claim 2 wherein the control module is arranged to selectively configure the voltage regulation module to operate in the first operating mode wherein the input is operably coupled to the first node.

6. The voltage regulator of claim 2 wherein the control module is further arranged to selectively configure the voltage regulation module to operate in a third operating mode in which the switching output of the voltage regulation module and the input of the voltage regulation module are operably coupled to the first node of the voltage regulation module.

7. The voltage regulator of claim 6 wherein the control module is arranged to selectively configure the voltage regulation module to operate in the third operating mode wherein the ground plane is operably coupled to the second node of the voltage regulation module.

8. The voltage regulator of claim 2 wherein the control module is further arranged to receive at an input thereof at least one control signal, and to cause the voltage regulation module to switch between the operating modes with a temporal ratio based at least partly on the at least one control signal.

9. The voltage regulator of claim 1 wherein the switching output of the voltage regulation module is selectively couplable to the first node by a first switching element controllable by a first configuration signal, and selectively couplable to the second node by a second switching element controllable by a second configuration signal.

10. The voltage regulator of claim 9 wherein the first, third and fourth switching elements comprise p-type metal oxide semiconductor field effect transistors (MOSFETs), and the second and fifth switching elements comprise n-type MOSFETs.

11. The voltage regulator of claim 1 wherein the input of the voltage regulation module is selectively couplable to the first node by a third switching element controllable by a third configuration signal, and selectively couplable to the second node by a fourth switching element controllable by a fourth configuration signal.

12. The voltage regulator of claim 11 wherein the first, third and fourth switching elements comprise p-type metal oxide semiconductor field effect transistors (MOSFETs), and the second and fifth switching elements comprise n-type MOSFETs.

13. The voltage regulator of claim 1 wherein the ground plane is selectively couplable to the second node by a fifth switching element controllable by a fifth configuration signal.

14. An envelope tracking power supply system comprising at least one voltage regulator according to claim 1.

15. The envelope tracking power supply system of claim 14 wherein the envelope tracking power supply system comprises at least a first voltage regulator, the at least first voltage regulator being operably coupled in parallel with a Class AB amplifier to provide a voltage supply to a power amplifier.

16. The envelope tracking power supply system of claim 15 wherein the envelope tracking power supply system further comprises at least one further voltage regulator, the at least one further voltage regulator being arranged to provide a voltage supply to the Class AB amplifier.

17. A transmitter module comprising an envelope tracking power supply system according to claim 14.

18. An integrated circuit device comprising at least one voltage regulator according to claim 1.

* * * * *